United States Patent
Lin (10) Patent No.: US 9,257,777 B2
(45) Date of Patent: Feb. 9, 2016

(54) FLASH DRIVE

(71) Applicant: PHISON ELECTRONICS CORP., Miaoli (TW)

(72) Inventor: Wei-Hung Lin, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 36 days.

(21) Appl. No.: 14/463,667

(22) Filed: Aug. 20, 2014

(65) Prior Publication Data
US 2016/0013578 A1   Jan. 14, 2016

(30) Foreign Application Priority Data

Jul. 10, 2014   (TW) .............................. 103212301 U (51) Int. Cl.
*H01R 13/44* (2006.01)
*H01R 13/60* (2006.01)
*H01R 13/46* (2006.01)
*H05K 5/02* (2006.01)

(52) U.S. Cl.
CPC .............. *H01R 13/46* (2013.01); *H05K 5/0217* (2013.01); *H05K 5/0278* (2013.01)

(58) Field of Classification Search
CPC ...... H01R 13/46; H05K 5/0278; H05K 5/0217
USPC .................................. 439/138, 135, 131, 660
See application file for complete search history.

(56) References Cited

U.S. PATENT DOCUMENTS

2014/0256164 A1* 9/2014 Lin ............................. 439/76.1

* cited by examiner

*Primary Examiner* — Javaid Nasri
(74) *Attorney, Agent, or Firm* — Jianq Chyun IP Office (57) ABSTRACT

A flash drive including a storage module and a rotating member is provided. The storage module has a carrier, a first connecting interface, and a second connecting interface. The carrier has a groove. The first and the second connecting interfaces are assembled to the carrier and disposed backward from each other at opposite sides of the carrier along a first axis. The rotating member has a driving portion connected to the groove. The rotating member is rotated on a rotation axis, such that the driving portion is slid in the groove, and the carrier is moved along the first axis. A traveling path of the first connecting interface along the first axis is different from a traveling path of the second connecting interface along the first axis.

13 Claims, 7 Drawing Sheets

FLASH DRIVE

CROSS-REFERENCE TO RELATED APPLICATION

This application claims the priority benefit of Taiwan application serial no. 103212301, filed on Jul. 10, 2014. The entirety of the above-mentioned patent application is hereby incorporated by reference herein and made a part of this specification.

BACKGROUND

1. Field of the Invention

The present invention relates to a flash drive.

2. Description of Related Art

With development of multimedia technology, produced digital files become larger in size. Although a conventional 1.44 MB floppy disk is easy to carry, a capacity thereof cannot meet current needs. Moreover, although a conventional disk-structure type hard disk can provide a large storage space, it is inconvenient to carry due to its large size. Recently, with the popularization of universal serial bus (USB) interfaces and the price reduction of flash memories, USB flash disks advantaged in large storage capacity, great compatibility and portability have been extensively applied to transmit data between various computers and storage devices.

A flash disk featuring in large storage capacity, plug-and-play, compact size and portability has taken the place of the floppy disk. The flash drive is electrically connected to a computer host and a storage module through a connector (e.g., a USB plug or an IEEE 1394 plug) by means of a storage component connected thereto.

However, in order to comply with various types of the electronic devices, the flash drive has be to adapted to different connection interfaces and commonly has two or more connection interface structures. Nevertheless, for users, the connection interfaces are subject to an issue of mutual interference if the structure of flash drive having the connection interfaces is not adaptively designed.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention is directed to a flash drive designed with different traveling paths, which contributes to enhancement in convenience of use.

According to an exemplary embodiment of the present invention, a flash drive including a storage module and a rotating member is provided. The storage module has a carrier, a first connecting interface, and a second connecting interface. The carrier has a groove. The first and the second connecting interfaces are disposed backward from each other at opposite sides of the carrier along a first axis. The rotating member has a driving portion connected to the groove. The rotating member rotates on a rotation axis, such that the driving portion is slid in the groove, and the carrier is moved along the first axis. A traveling path of the first connecting interface along the first axis is different from a traveling path of the second connecting interface along the first axis.

To sum up, in the present invention, the driving portion of the rotating member is slidably coupled in the groove of the storage module, such that the rotary motion of the rotating member causes the storage module to move linearly back and forth. Moreover, the first and the second connecting interfaces of the storage module have different traveling paths according to the movement of the carrier. In this way, a user can smoothly switch between different connection interfaces, so as to avoid inconvenience of use due to the different sizes of the connection interfaces. Therefore, the flash drive having the aforementioned structural characteristics can be used for different connection interfaces, which contributes to increasing the application range of the flash drive.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 1:
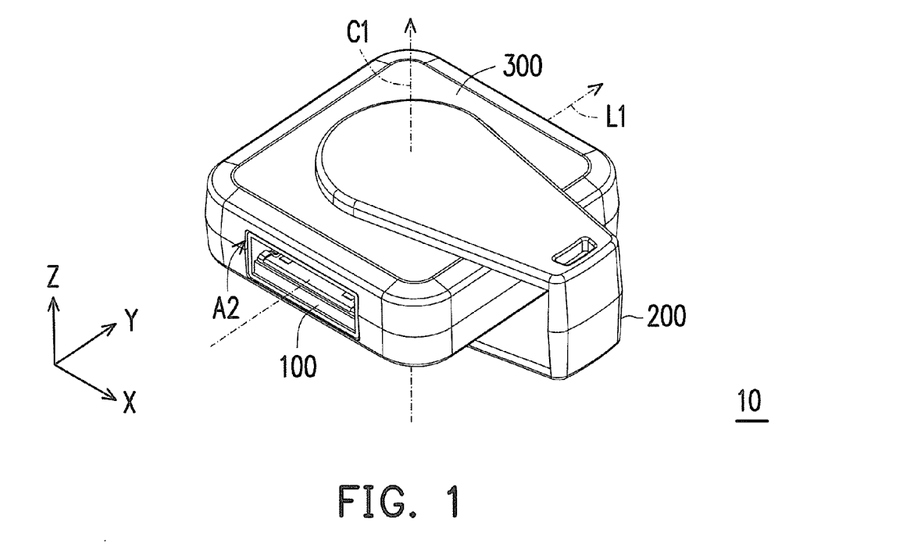
FIG. 1 and FIG. 2 are perspective diagrams in different viewing angles respectively illustrating a flash drive according to the embodiments of the invention.
Figure 2:
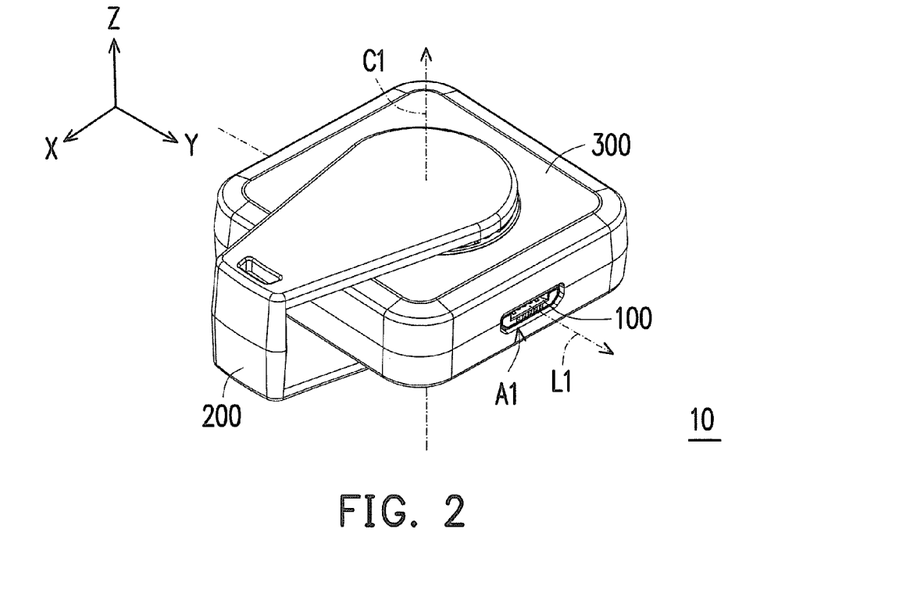
Figure 3:
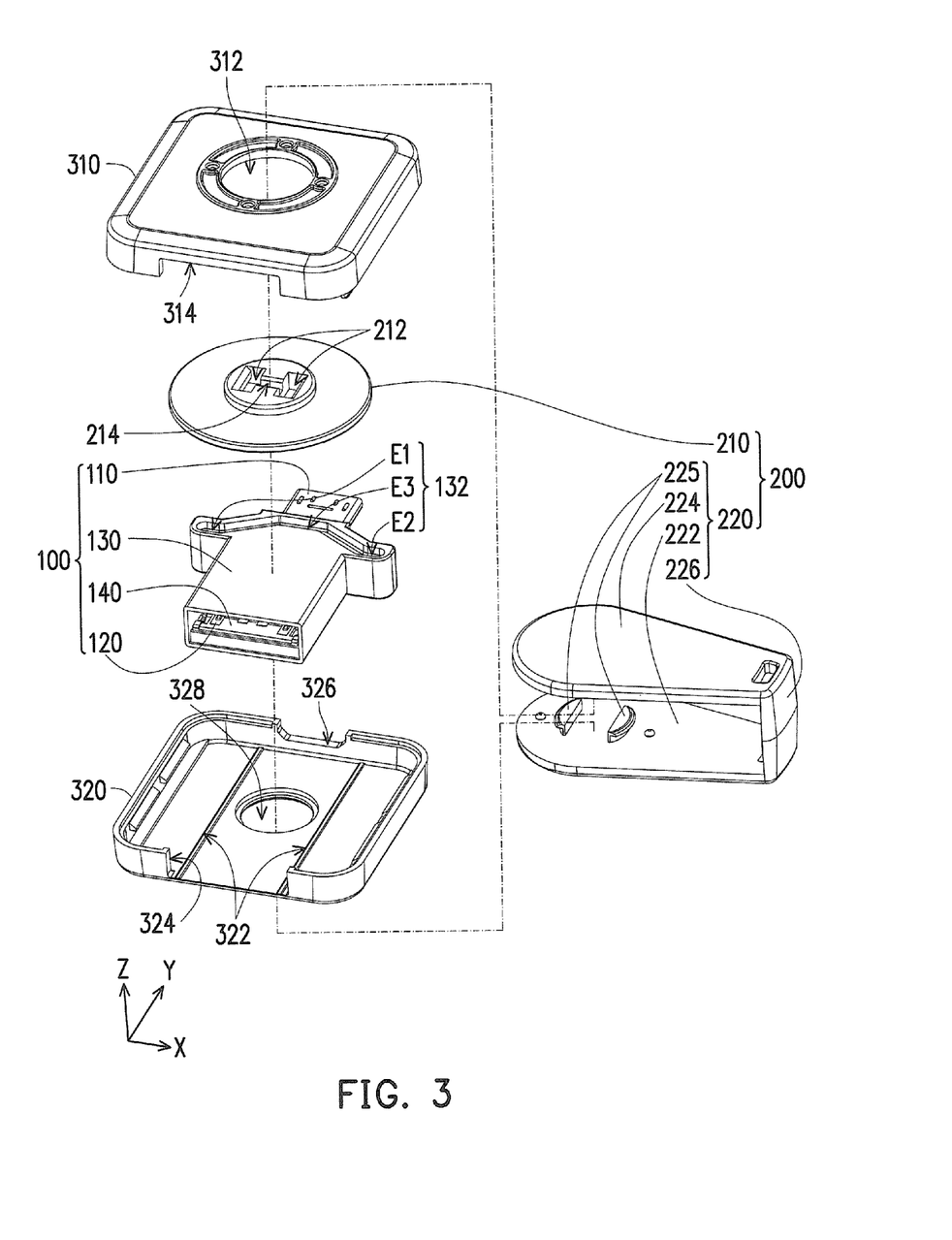
FIG. 3 and FIG. 4 are exploded diagrams in different viewing angles respectively illustrating a flash drive according to the embodiments of the invention.
Figure 4:
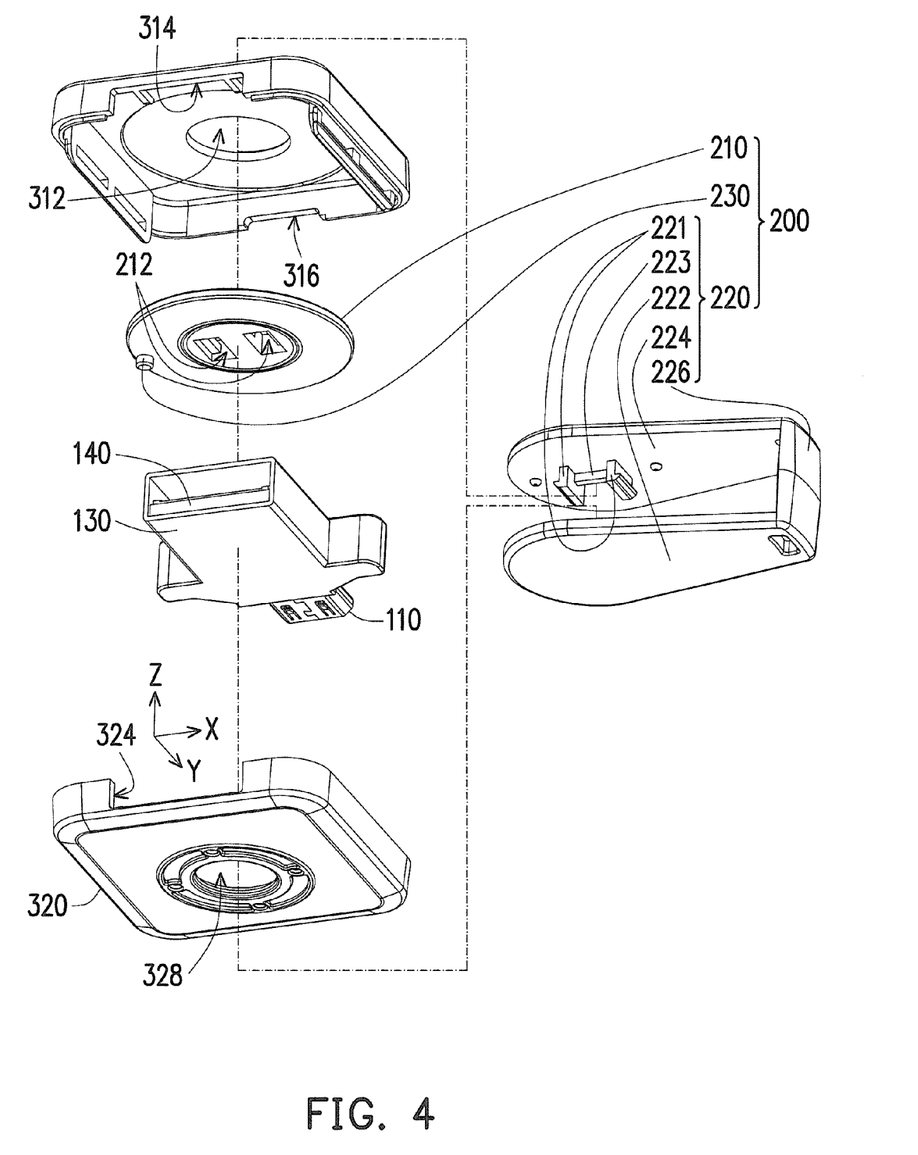

FIG. 1 and FIG. 2 are perspective diagrams in different viewing angles respectively illustrating a flash drive of the present invention. FIG. 3 and FIG. 4 are exploded diagrams in different viewing angles respectively illustrating a flash drive of the present invention. Herein, a three-dimensional coordinate system is provided for describing the elements conveniently. Referring to FIG. 1 through FIG. 4, in the present exemplary embodiment, a flash drive 10 includes a storage module 100, a rotating member 200 and a housing 300. The storage module 100 is movably disposed in the housing 300. The storage module 100 includes a carrier 130, a first connecting interface 110, a second connecting interface 120, and a storage element 140. The carrier 130 has a groove 132. The first connecting interface 110 and the second connecting interface 120 are assembled to the carrier 130 along the first axis L1 and disposed backward from each other at opposite sides of the groove 132. In this case, the first axis L1 is parallel to the Y-axis.

Correspondingly, the rotating member 200 includes a disc body 210, a rotation arm 220 and a driving portion 230 (illustrated in FIG. 4). The disc body 210 is movably disposed in the housing 300; the rotation arm 220 is located outside the housing 300 and connected to the disc body 210. The driving portion 230 is, for example, a protrusion, extending from the disc body 210 toward the carrier 130 and arriving at the groove 132, such that the driving portion 230 is slidably connected to the groove 132. In this way, when the rotating member 200 rotates on a rotation axis C1 (which is parallel to the Z-axis) relatively to the housing 300, the rotary motion of the rotation member 200 rotating on the rotation axis C1 may be converted into straight-line motion of the storage module 100 moving along the first axis L1 due to the driving portion 230 being coupled in the groove 132, such that with change of the rotating direction, the first connecting interface 110 and the second connecting interface 120 may move with the carrier 130 along the first axis L1.

Figure 5:
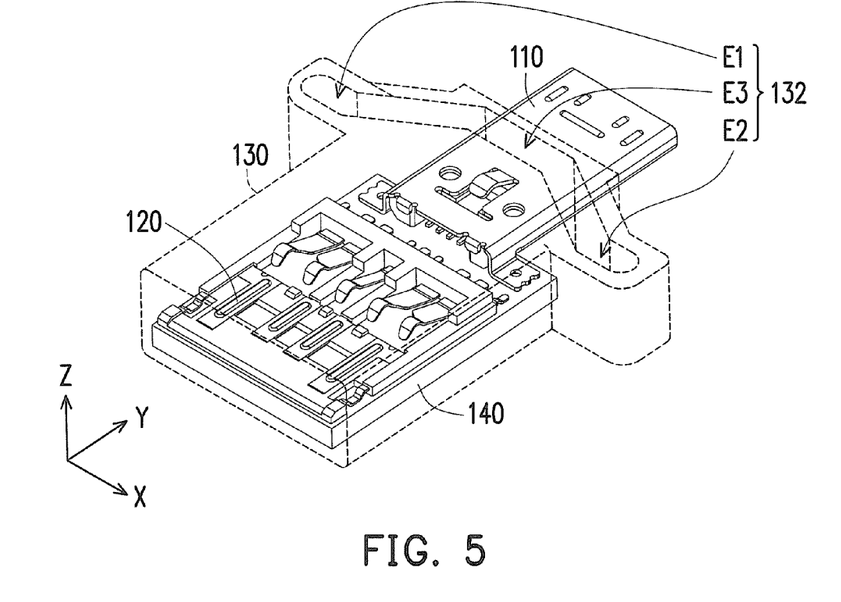
FIG. 5 is a schematic diagram illustrating a storage module according to the embodiments of the invention.

In detail, FIG. 5 is a schematic diagram illustrating a storage module according to the embodiments of the invention, where the carrier 130 is illustrated by using a dotted line for clearly identifying the storage element 140 disposed therein. Referring to FIG. 3 through FIG. 5 simultaneously, in the present exemplary embodiment, the storage element 140 is disposed inside the carrier 130, and the first connecting interface 110 and the second connecting interface 120 are disposed at opposite sides of the storage element 140. In addition, the storage module 140 is, for example, an element fabricated by a system in package (SIP) process, namely, an element formed by a package body including one or more chips where any one or more elements, such as passive elements, capacitors, resistors, connection interfaces, antennas are disposed. The second connecting interface 120 is formed by a plurality of terminals disposed on the storage element 140 and complying with the universal series bus (USB) standard and part of the carrier 130 in common, and the first connecting interface 110 is formed by a plurality of terminals disposed on the storage element 140 and complying with the micro universal series bus (Micro-USB). Accordingly, sizes of the first connecting interface 110 and the second connecting interface 120 are different from each other along the Y-axis.

It should also be noted that the first connecting interface 110 and the second connecting interface 120 backward from each other may move with the carrier 130 along the Y-axis, and "backward from each other" referred to herein means that a direction (i.e., a direction along the positive Y-axis) to connect the first connecting interface 110 (toward another electronic device) and a direction (i.e., a direction along the negative Y-axis) to connect the second connecting interface 120 (toward another electronic device) are opposite to each other. However, the present invention is not intended to limit the types of the connection interfaces, and the storage module 100 of the present invention is applicable to any storage module having various connection interfaces.

Referring to FIG. 3 and FIG. 4, the housing 300 includes an upper housing 310 and a lower housing 320. The lower housing 320 has a stepwise structure having stairs with different heights along the Z-axis, such that a rail track 322 for the carrier 300 to slide along the first axis L1 in the housing 300 is formed. The upper housing 310 has notches 314 and 316 disposed along the first axis L1, and the lower housing 320 has notches 324 and 326 disposed along the first axis L1, such that the storage module 100 may be slidably held between the upper housing 310 and the lower housing 320 after they are assembled to each other. A first opening A1 (illustrated in FIG. 2) is formed by the notches 316 and 326, and a second opening A2 is formed by the notches 314 and 324, such that the first opening A1 is corresponding to the first connecting interface 110, and the second opening A2 is corresponding to the second connecting interface 120. Sizes of the openings are not limited herein and can be adaptively modified corresponding to the first connecting interface 110 and the second connecting interface 120. Namely, in different exemplary embodiments, the size of the first opening A1 may be larger than, identical to or smaller than the size of the second opening A2.

Furthermore, the disc body 210 of the rotating member 200 is rotated on the rotation axis C1 and disposed between the upper housing 210 and the storage module 100. The disc body 210 has a pair of first locking holes 212 and a second locking hole 214, where the first locking holes 212 are through holes, and the second locking hole 214 is a bind hole. The rotation arm 220 is U-shaped and has two side portions 222 and 224 and a base portion 226 which is connected between the two side portions 222 and 224. The side portion 224 is connected with the disc body 210, and the side portion 222 is pivoted to the lower housing 320. Furthermore, the rotation arm 220 further has first locking portions 221 and a rib portion 223 located on an inner surface of the side portion 224, and the first locking portions 221 passing through the opening 312 of the upper housing 310 are correspondingly locked to the first locking holes 212, such that the rib portion 223 may extend into the second locking hole 214. On the other hand, the rotation arm 220 further has second locking portions 225 located on an inner surface of the side portion 222, and the second locking portions 225 passing through the opening 328 of the lower housing 320 are rotatably locked to a side edge of the opening 328 (as shown in FIG. 3). In this way, the rotation arm 220 may rotatably clip the housing 330 between the side portions 222 and 224, such that a user may drive the rotation arm 220 to rotate on the rotation axis C1 relatively to the housing 300 to drive the disc body 210 inside the housing 300 to rotate synchronously. Thus, an effect of the driving portion 230 on the disc body 210 moving the storage module 110 by means of the groove 132 can be achieved. In another exemplary embodiment which is not shown, the disc body and the rotation arm may be the same element, namely, the disc body and the rotation arm may be designed as an integrated structure.

Figure 6:
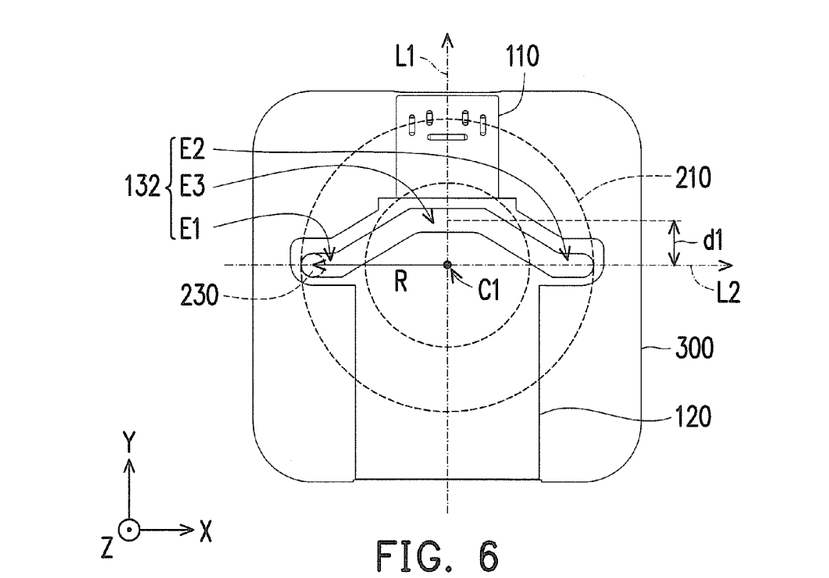
FIG. 6 is a schematic diagram illustrating part of elements of the flash drive of FIG. 1.

FIG. 6 is a schematic diagram illustrating part of elements of the flash drive of FIG. 1. In order to clearly illustrate the corresponding relation between the storage module 100 and the rotating member 200, part of elements of the flash drive of FIG. 1 are illustrated in a top-view angle. First, referring to FIG. 5 and FIG. 6, in the present exemplary embodiment, the groove 132 substantially extends along a second axis L2 (which is parallel to the X-axis) and is divided into a first section E1, a second section E2 and a contrary flexure portion E3 which is connected between the first section E1 and the second section E2. The contrary flexure portion E3 is bent toward the first axis L1 (i.e., the first section E1 and the second section E2 may be considered as located on the second axis L2), and the contrary flexure portion E3 is substantially bent toward the first connecting interface 110 as shown in FIG. 5. In other words, the first section E1 and the second section E2 of the groove 132 extend along the second axis L2, and the contrary flexure portion E3 is in a state of being bent from the second axis L2 toward the first connecting interface 110 on the first axis L1.

Referring to FIG. 6, the rotation axis C1 of the rotating member is substantially located on the first axis L1, while the rotation axis C1 may be considered as being located on both the first axis L1 and the second axis L2, such that the groove 132 is disposed in a mirror symmetry manner relative to the first axis L1. Moreover, the driving portion 230 has a radius R relative to the rotation axis C1, and the contrary flexure portion E3 has a distance d1 relative to the first section E1 or the second section E2. In this way, when rotating on the rotation axis C1, the rotating member 200 may drive the carrier 130 to move along the first axis L1 by means of the driving portion 230 sliding in the groove 132, and traveling paths of the first connecting interface 110 and the second connecting interface 120 respectively along the first axis L1 may be further defined according to the radius R and the distance d1.

Figure 7:
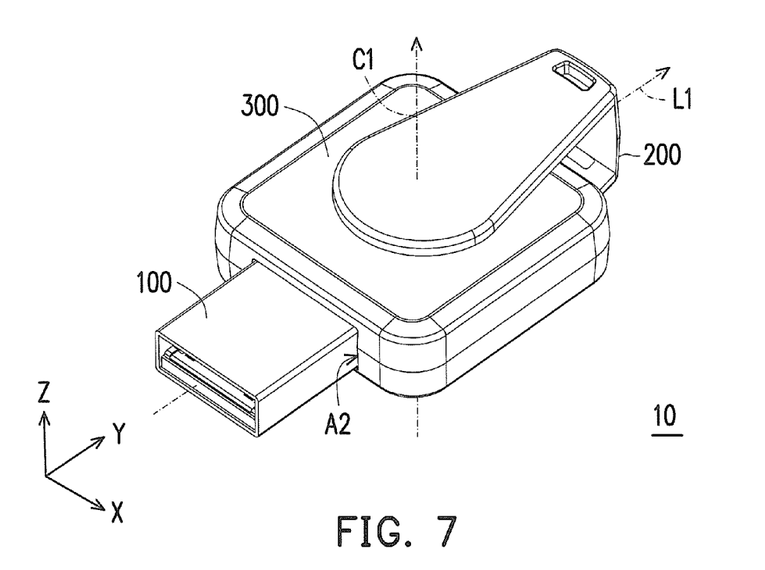
FIG. 7 and FIG. 9 are schematic diagrams respectively illustrating the flash drive of FIG. 1 in other states.
Figure 8:
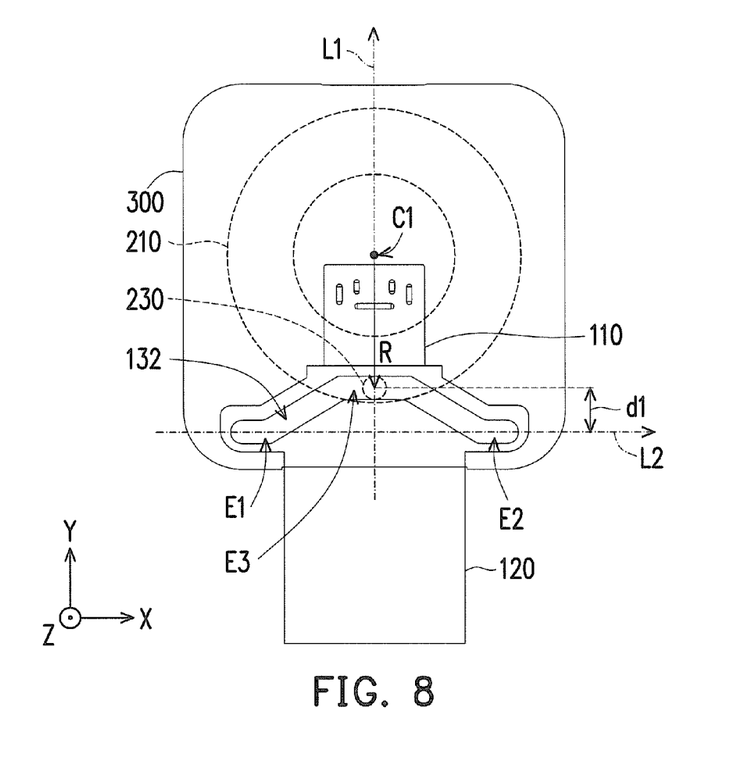
FIG. 8 and FIG. 10 are schematic diagrams respectively illustrating part of elements of the flash drive.
Figure 9:
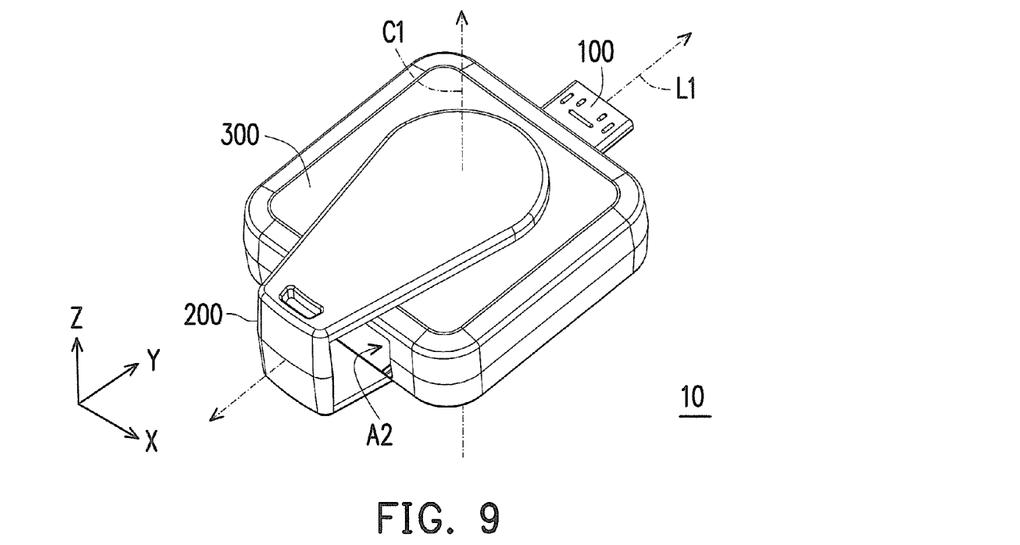
Figure 10:
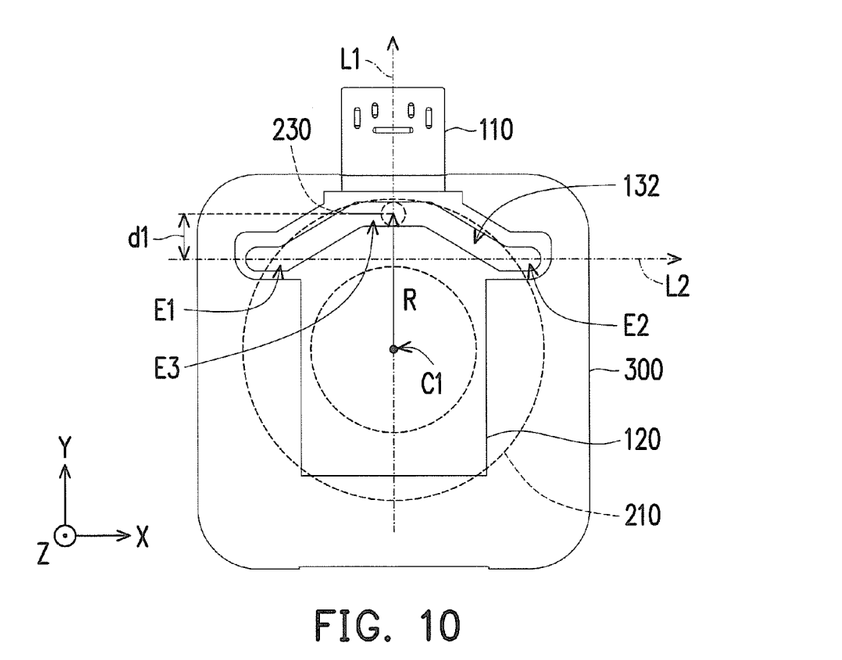

In detail, FIG. 7 and FIG. 9 are schematic diagrams respectively illustrating the flash drive of FIG. 1 in other states, FIG. 8 and FIG. 10 are schematic diagrams respectively illustrating part of elements of the flash drive and corresponding to the states illustrated in FIG. 7 and FIG. 9, and for convenient identification, the first opening A1 and the second opening A2 will be described with reference to FIG. 1 and FIG. 2 hereinafter. Referring to FIG. 1 (or FIG. 2), FIG. 6 and FIG. 10, in the present exemplary embodiment, when the disc body 210 rotates that the driving portion 230 thereon slides from the first section E1 to the contrary flexure portion E3 in the groove 132, i.e., the driving portion 230 slides from a position where it was on the second axis L2 as shown in FIG. 6 toward the first connecting interface 110 and arrives in a position where it is on the first axis L1 as shown in FIG. 10, the driving portion 230 pushes the carrier 130 to move toward the positive Y-axial direction by means of the driving portion 230 sliding in the groove 132, such that the first connecting interface 110 protrudes out of the housing 300 through the first opening A1. In this case, a first traveling path of the first connecting interface 110 substantially moving along the first axis L1 is (R−d1). Then, if the driving portion 230 in this case slides back to the first section E1 along the original path, or continuously slides from the contrary flexure portion E3 to the second section E2, the driving portion 230 may further drive the carrier 130 to move toward the negative Y-axial direction and returns, namely, the first connecting interface 110 moves back to the housing 300 in the first traveling path (R−d1) along the first axis L1.

Additionally, when the disc body 210 in the state shown in FIG. 6 rotates but in the opposite direction, i.e., the driving portion 230 slides toward the second connecting interface 120 and arrives in a position where it is as shown in FIG. 8, the driving portion 230 slides from the first section E1 to the contrary flexure portion E3 in the groove 132 in the same way, but achieves an effect opposite to the effect above, namely, the driving portion 230 pushes the carrier 130 to move along the negative Y-axial direction, such that the second connecting interface 120 protrudes out of the housing 300 through the second opening A2, and in this case, a second traveling path of the second connecting interface 120 moving along the first axis L1 is (R+d1), as shown in FIG. 8. Similarly, when the driving portion 230 in the state shown in FIG. 8 slides back to the first section E1 along the original path or continuously slides from the contrary flexure portion E3 to the second section E2, the second connecting interface 120 may be retracted back into the housing 300 in the second traveling path (R+d1) along the first axis L1 due to the returning of the carrier 130.

In brief, the driving portion 230 of the present exemplary embodiment slides toward the position where the first connecting interface 110 is located, such that the carrier 130 moves toward the positive Y-axial direction to lead the flash drive 10 to protrude the first connecting interface 110. Conversely, when the driving portion 230 departs away from the position where the first connecting interface 110 is located, the first connecting interface 110 is driven to be retracted back into the housing 300. Correspondingly, when the driving portion 230 slides toward the position where the second connecting interface 120 is located, the carrier 130 moves toward the negative Y-axial direction and drives the flash drive 10 to protrude the second connecting interface 120 or otherwise, drives the second connecting interface 120 to be retracted back into the housing 300.

Accordingly, sizes of the first connecting interface 110 and the second connecting interface 120 respectively along the first axis L1 are different from each other. Moreover, it is apparent according to FIG. 6 that the size of the first connecting interface 110 along the first axis L1 is smaller than the size of the second connecting interface 120 along the first axis L1, and therefore, the structure of the storage module 100 has to be further designed, such that each connection interface of the flash drive 10 may protrude out of or be retracted into the housing 300 in its corresponding traveling path, and the user may thereby smoothly switch to different connection interfaces. In the present exemplary embodiment, the rotation axis C1 which the disc body 210 of the rotating member 200 rotates on is substantially located in an eccentric position of the housing 300, where the eccentric position refers to a position which deviates from a center of figure of the housing 300, such that a distance of the rotating member 200 relative to the first opening A1 is smaller than a distance of the rotating member 200 relative to the second opening A2. In the meantime, as described above, the contrary flexure portion E3 of the groove 132 is bent in a direction facing toward the first connecting interface 110, and thus, the first traveling path (R−d1) of the first connecting interface 110 can match the size of the first connecting interface 110 along the Y-axis (i.e., the first connecting interface 110 may completely protrude out of the housing 300). Correspondingly, the second traveling path (R+d1) of the second connecting interface 120 can match the size of the second connecting interface 120 along the Y-axis (i.e., the second connecting interface 120 may completely protrude out of the housing 300). In this way, the user may rotate the disc body 210 to move the first connecting interface 110 or the second connecting interface 120 out of the housing 300 without causing any interference between the first connecting interface 110 and the second connecting interface 120.

The present invention is not intended to limit the configuration of the groove 132 on the carrier 130. Referring to FIG.

6, the carrier 130 is divided into opposite sides by the first axis L1, and the groove 132 is disposed in a mirror symmetry manner relative to the first axis L1.

Figure 11:
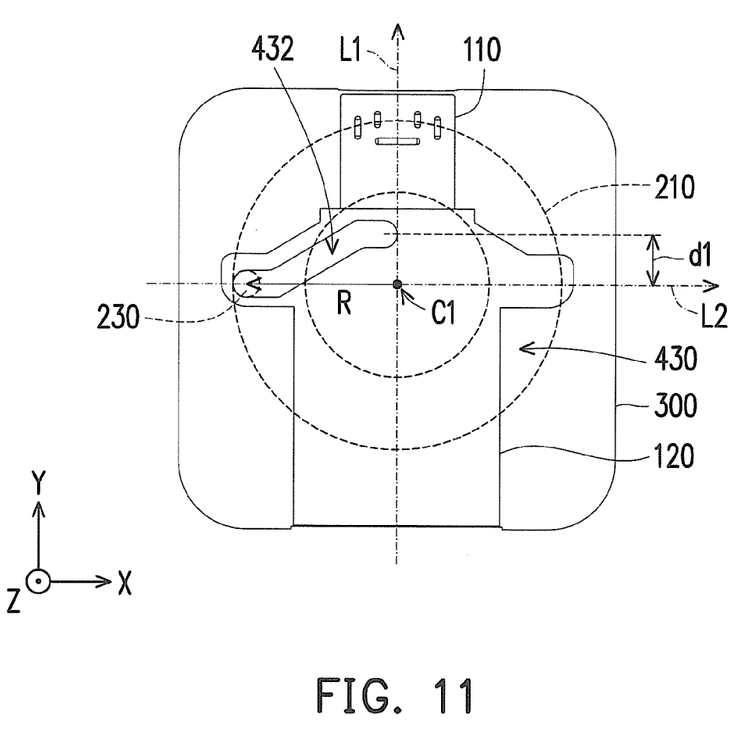
FIG. 11 is a schematic diagram illustrating part of elements of a flash drive according to another embodiment of the present invention.

In addition, FIG. 11 is a schematic diagram illustrating part of elements of a flash drive according to another embodiment of the present invention. With reference to FIG. 11, different from the exemplary embodiments above, a carrier 430 is divided into opposite sides by the first axis L1, and a groove 432 of the present exemplary embodiment is located at one of the sides and tilts toward the first axis L1 (and also tilts toward the second axis L2 simultaneously). Namely, a path length of the groove 432 is half the path length of the groove 132. In this way, when the disc body 210 rotates such that the driving portion 230 drives the carrier 430 by means of the groove 432, the carrier 430 moves along the first axis L1, i.e., the groove 432 of the present exemplary embodiment provides a position-limiting effect for the driving portion 230, and thus, the disc body 210 rotates on the rotation axis C1 back and forth within an angle range of 180 degrees. For example, referring to a state shown in FIG. 11, the groove 432 in this scenario has opposite ends respectively adjacent to the first axis L1 and the second axis L2. When the driving portion 230 slides from the state shown in FIG. 11 toward the position where the first connecting interface 110 is located and arrives one of the ends of the groove 432 adjacent to the first axis L1, the first connecting interface 110 is protruded out of the housing 300. Relatively, when the driving portion 230 slides from the state shown in FIG. 11 toward the position where the second connecting interface 120 is located and the end adjacent to the first axis L1, the second connecting interface 120 is protruded out of the housing 300. Accordingly, in the present exemplary embodiment, the effect that the first connecting interface 110 and the second connecting interface 120 take turns to protrude out or be retracted into the housing can also be achieved.

According to the exemplary embodiment, the effect can be achieved when the groove of the present invention is located at at least one of the sides of the first axis L1.

Additionally, referring to FIG. 7 and FIG. 9, the user may apply force to the rotation arm 220 to drive the disc body 210 inside the housing 300 to rotate on the rotation axis C1 relatively to the housing 300. In this way, when the first connecting interface 110 protrudes out of the housing 300 through the first opening A1, the base portion 226 of the rotation arm 220 is located at the second opening A2, and when the second connecting interface 120 protrudes out of the housing 300 through the second opening A2, the base portion 226 of the rotation arm 220 is located at the first opening A1. Thereby, the user can use the first connecting interface 100 or the second connecting interface 120 by holding the rotation arm 200 without interference.

Based on the above, in the exemplary embodiments of the present invention, the driving portion of the rotating member is slidably coupled in the groove of the carrier, such that the rotary motion of the rotating member leads to the straight-line motion of the carrier. Moreover, the first and the second connecting interfaces of the storage module are assembled to the carrier along the first axis and have different traveling paths with the movement of the carrier. Thereby, the user can smoothly switch between different connection interfaces. Furthermore, the groove extends along the second axis and has the contrary flexure portion bent toward the first axis (i.e., the first connecting interface), and thus, based on the radius of the rotating member, the traveling path of the first connecting interface is different from the traveling path of the second connecting interface that are corresponding to different sizes of the first connecting interface and the second connecting interface. Accordingly, with the structure characteristics, the present invention can facilitate in the convenience for the user to use the flash drive, without causing the first connecting interface and the second connecting interface interfering with each other. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash drive, comprising:
   a storage module, having a carrier, a first connecting interface and a second connecting interface, wherein the carrier has a groove, the first connecting interface and the second connecting interface are disposed backward from each other at opposite sides of the carrier along a first axis; and
   a rotating member, having a driving portion connected to the groove and rotating on a rotation axis, such that the driving portion is slid in the groove, and the carrier is moved along the first axis, wherein a traveling path of the first connecting interface along the first axis is different from a traveling path of the second connecting interface along the first axis.

2. The flash drive according to claim 1, wherein the groove extends along a second axis different from the first axis and has a contrary flexure portion bending toward the first axis.

3. The flash drive according to claim 2, wherein the first axis is perpendicular to the second axis, and the rotation axis is located on the first axis and orthogonal to a plane formed by the first axis and the second axis.

4. The flash drive according to claim 2, wherein the groove further has a first section and a second section located on the second axis and opposite to each other, and the contrary flexure portion is connected between the first section and the second section.

5. The flash drive according to claim 4, wherein the contrary flexure portion has a distance (d1) relative to the first section or the second section along the first axis, the driving portion has a radius (R) relative to the rotation axis, when the driving portion drives the carrier to move, a first traveling path of the first connecting interface moving along the first axis is (R−d1), and a second traveling path of the second connecting interface moving along the first axis is (R+d1).

6. The flash drive according to claim 5, further comprising:
   a housing, having a first opening and a second opening located on the first axis, wherein the storage module is movably disposed along the first axis in the housing, the rotating member is movably assembled to the housing, the first opening is corresponding to the first connecting interface, and the second opening is corresponding to the second connecting interface, when the driving portion is located at the first section or the second section, the first connecting interface and the second connecting interface are located in the housing, and when the driving portion is driven from the first section or the second section to the contrary flexure portion, the first connecting interface moves in the first traveling path to protrude out of the housing through the first opening, or the second connecting interface moves in the second traveling path to protrude out of the housing through the second opening.

7. The flash drive according to claim 6, wherein the rotation axis is located on an eccentric position of the housing, such that a distance of the rotation axis relative to the first opening is smaller than a distance of the rotation axis relative to the second opening.

8. The flash drive according to claim 6, wherein the rotating member further has a disc body and a rotation arm, the disc body is pivoted to the housing about the rotation axis, the driving portion extends from the disc body toward the carrier and arrives the groove, and the rotation arm is connected with the disc body and located outside the housing.

9. The flash drive according to claim 8, wherein the rotation arm is U shape, has two side portions and a base portion connected with the two side portions, one of the side portions is connected with the disc body, and the other side portion is pivoted to the housing, when the first connecting interface is protruded out of the housing through the first opening, the base portion is located at the second opening, and when the second connecting interface is protruded out of the housing through the second opening, the base portion is located at the first opening.

10. The flash drive according to claim 2, wherein the contrary flexure portion is bent toward the first connecting interface, and a size of the first connecting interface along the first axis is smaller than a size of the second connecting interface along the first axis.

11. The flash drive according to claim 2, wherein the groove is disposed in a mirror symmetry manner relative to the first axis.

12. The flash drive according to claim 1, wherein the first axis divides the carrier into opposite sides, the groove is located at one of the sides and tilts toward the first axis.

13. The flash drive according to claim 1, wherein the storage module further has a storage element disposed in the carrier, and the first connecting interface and the second connecting interface are disposed at opposite sides of the storage element along the first axis.

* * * * *